(12) United States Patent
Boyd et al.

(10) Patent No.: US 9,117,860 B2
(45) Date of Patent: Aug. 25, 2015

(54) CONTROLLED AMBIENT SYSTEM FOR INTERFACE ENGINEERING

(75) Inventors: John Boyd, Hillsboro, OR (US); Yezdi Dordi, Palo Alto, CA (US); Tiruchirapalli Arunagiri, Fremont, CA (US); Benjamin W. Mooring, Austin, TX (US); John Parks, Hercules, CA (US); William Thie, Mountain View, CA (US); Fritz C. Redeker, Fremont, CA (US); Arthur M. Howald, Pleasanton, CA (US); Alan Schoepp, Ben Lomond, CA (US); David Hemker, San Jose, CA (US); Carl Woods, Aptos, CA (US); Hyungsuk Alexander Yoon, San Jose, CA (US); Aleksander Owczarz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1900 days.

(21) Appl. No.: 11/639,752

(22) Filed: Dec. 15, 2006

(65) Prior Publication Data

US 2008/0057221 A1    Mar. 6, 2008

Related U.S. Application Data

(63) Continuation-in-part of application No. 11/513,634, filed on Aug. 30, 2006, now Pat. No. 8,771,804.

(51) Int. Cl.
*H05H 1/24* (2006.01)
*C23C 16/00* (2006.01)
*H01L 21/67* (2006.01)
*H01L 21/288* (2006.01)
*H01L 21/768* (2006.01)
(Continued)

(52) U.S. Cl.
CPC ........ *H01L 21/67225* (2013.01); *H01L 21/288* (2013.01); *H01L 21/6704* (2013.01);
(Continued)

(58) Field of Classification Search
CPC ................ H01L 21/6723; H01L 21/67184
USPC .................................................. 156/345.32
See application file for complete search history.

(56) References Cited

U.S. PATENT DOCUMENTS 5,627,105 A    5/1997  Delfino et al. ................ 438/627
5,935,395 A    8/1999  Ouellet et al. ........... 204/298.07
(Continued)

FOREIGN PATENT DOCUMENTS

| JP | 8-8318 | 1/1996 |
| JP | 9-275142 | 10/1997 |
| JP | 2003-318262 | 11/2003 |

*Primary Examiner* — Parviz Hassanzadeh
*Assistant Examiner* — Nathan K Ford
(74) *Attorney, Agent, or Firm* — Martine Penilla Group, LLP

(57) ABSTRACT

A cluster architecture and methods for processing a substrate are disclosed. The cluster architecture includes a lab-ambient controlled transfer module that is coupled to one or more wet substrate processing modules. The lab-ambient controlled transfer module and the one or more wet substrate processing modules are configured to manage a first ambient environment. A vacuum transfer module that is coupled to the lab-ambient controlled transfer module and one or more plasma processing modules is also provided. The vacuum transfer module and the one or more plasma processing modules are configured to manage a second ambient environment. And, a controlled ambient transfer module that is coupled to the vacuum transfer module and one or more ambient processing modules is also included. The controlled ambient transfer module and the one or more ambient processing modules are configured to manage a third ambient environment. The cluster architecture therefore enables controlled processing of the substrate in either the first, second or third ambient environments, as well as during associated transitions.

13 Claims, 8 Drawing Sheets

(52) U.S. Cl.
CPC ...... *H01L21/6723* (2013.01); *H01L 21/67167* (2013.01); *H01L 21/67184* (2013.01); *H01L 21/76849* (2013.01)

(56) References Cited

U.S. PATENT DOCUMENTS

| | | | |
|---|---|---|---|
| 6,017,820 A * | 1/2000 | Ting et al. | 438/689 |
| 6,319,831 B1 | 11/2001 | Tsai et al. | 438/678 |
| 6,333,265 B1 | 12/2001 | Dixit et al. | |
| 6,518,203 B2 | 2/2003 | Narwankar et al. | 438/776 |
| 2002/0064942 A1 | 5/2002 | Dixit et al. | 438/637 |
| 2003/0155590 A1 | 8/2003 | Hatano et al. | |
| 2004/0040504 A1 * | 3/2004 | Yamazaki et al. | 118/715 |
| 2005/0221621 A1 * | 10/2005 | Mikhaylichenko et al. | 438/745 |
| 2006/0033678 A1 * | 2/2006 | Lubomirsky et al. | 345/32 |
| 2007/0274810 A1 * | 11/2007 | Holtkamp et al. | 414/217 |

* cited by examiner

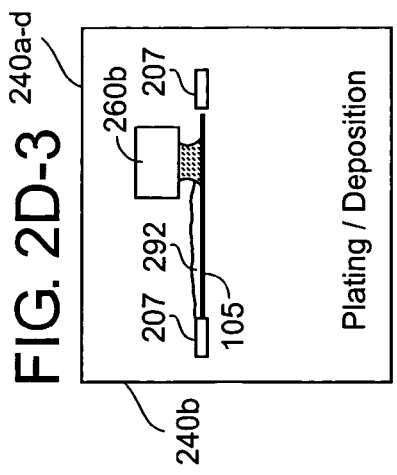
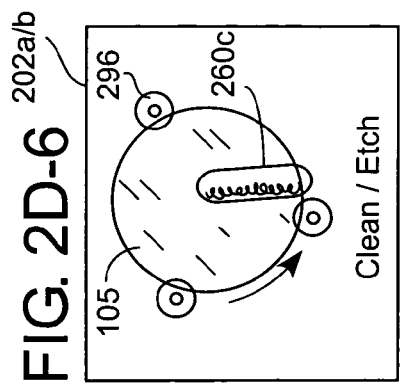
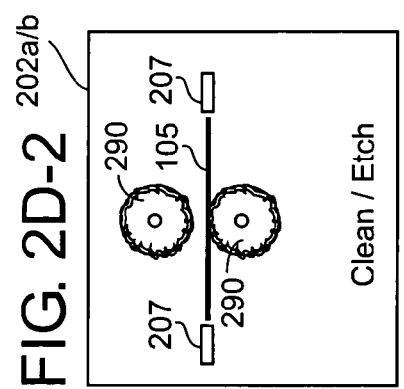
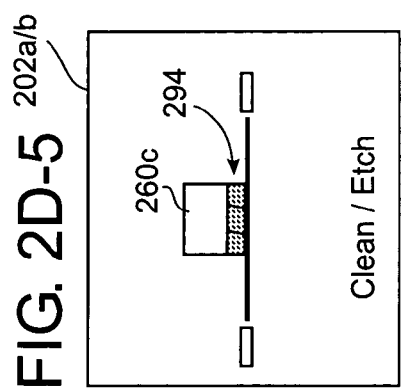
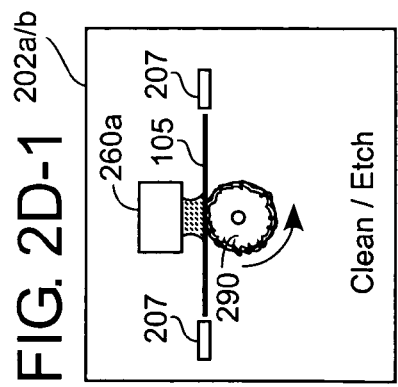
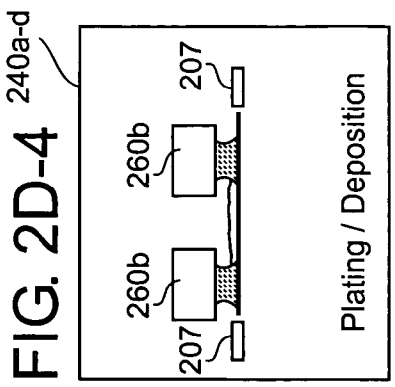



CONTROLLED AMBIENT SYSTEM FOR INTERFACE ENGINEERING

CLAIM OF PRIORITY

This application is a continuation-in-part of U.S. application Ser. No. 11/513,634, filed on Aug. 30, 2006, now U.S. Pat. No. 8,771,804 and entitled "Processes and Systems for Engineering a Copper Surface for Selective Metal Deposition", and is herein incorporated by reference.

CROSS REFERENCE TO RELATED APPLICATION

This application is related to U.S. application Ser. No. 11/514,038, filed on Aug. 30, 2006, and entitled "Processes and Systems for Engineering a Barrier Surface for Copper Deposition", and U.S. application Ser. No. 11/513,446, filed on Aug. 30, 2006, and entitled "Processes and Systems for Engineering a Silicon-Type Surface for Selective Metal Deposition to Form a Metal Silicide", both of which are incorporated herein by reference. Further, this application is related to U.S. application Ser. No. 11/461,415, entitled "System and Method for Forming Patterned Copper lines Through Electroless Copper Plating," filed on Jul. 27, 2006, and is herein incorporated by reference. Additionally, this application is related to U.S. application Ser. No. 11/611,758, entitled Method For Gap fill in Controlled Ambient System, and filed on Dec. 15, 2006, which is herein incorporated by reference.

BACKGROUND

Semiconductor processing is generally performed in a highly controlled manner, with strict controls on environments and tool operations. Clean rooms that house these tools, for instance, must meet strict requirements that limit the amount of particles that can be generated during operation, and other controlled parameters. Substrates, when in process, may be required to move between many systems, and many times, the movements between the systems are repeated many times depending on the desired devices, layers and structures that need to be processed to create an integrated circuit device.

Although semiconductor equipment must meet tight regulations to qualify for production of semiconductor wafers, these regulations are most usually coupled to the individual tools. In operation, if a wafer needs to be processed in a wet tool, the tool completes its processing and then the substrate will have to be transported to another tool, which may be dry. In production, these substrates may be moved between tools using clean room automated systems. Typically, substrates are transported or moved in closed containers, and then coupled to other tools. Thus, if a plasma processing operation is needed, the substrate(s) may be moved to a cluster tool, which is defined by one or more transfer modules and dry processing modules.

Plasma processing modules are generally tied together in a cluster, but the cluster is limited to types of plasma processing or processes having a same ambient. That is, if the processing is dry (e.g., plasma processing), the substrate will be handled within that cluster until the process requires movement to a different type of system. Transport of the substrates between modules and clusters is handled in a very careful way, however, substrates are exposed to oxygen. The oxygen may be the oxygen present in the clean room (or closed containers), and although the environment is controlled and clean, exposure to oxygen during a movement can cause oxidation of features or layers, before a next operation can be performed. Many times, the simple known exposure to oxygen during transport within the clean room causes fabrication sequences to include additional oxide removal steps, at more cost and cycles. However, even if oxide removal steps are performed, the queue time before a next step may still cause the generation of some oxidation.

In view of the foregoing, there is a need for systems, structures and methods for handling substrates during the fabrication process, while avoiding unnecessary exposure to an uncontrolled ambient.

SUMMARY

Broadly speaking, the embodiments fill the need by providing cluster architectures for processing substrates, and method for enabling the transitions among the modules of the cluster. The processing of substrates is performed in a controlled ambient environment during each stage of processing, as well as during transfers between one or more transfer modules. It should be appreciated that the present invention can be implemented in numerous ways, including as a solution, a method, a process, an apparatus, or a system. Several inventive embodiments of the present invention are described below.

In one embodiment, a cluster architecture for processing a substrate is disclosed. The cluster architecture includes a lab-ambient controlled transfer module that is coupled to one or more wet substrate processing modules. The lab-ambient controlled transfer module and the one or more wet substrate processing modules are configured to manage a first ambient environment. A vacuum transfer module that is coupled to the lab-ambient controlled transfer module and one or more plasma processing modules is also provided. The vacuum transfer module and the one or more plasma processing modules are configured to manage a second ambient environment. And, a controlled ambient transfer module that is coupled to the vacuum transfer module and one or more ambient processing modules is also included. The controlled ambient transfer module and the one or more ambient processing modules are configured to manage a third ambient environment. The cluster architecture therefore enables controlled processing of the substrate in either the first, second or third ambient environments. In one example, the first, second and third ambient environments are isolated by slot valves and load locks. The slot valves define isolation between the ambient environments when transitions of the substrate are provided through the load locks, where dry plasma processing and wet processing is enabled within the cluster architecture without exposure of the substrate to an oxygen environment, that is outside of the cluster architecture.

In another embodiment, a method for processing a substrate in a cluster architecture is disclosed. The method includes configuring a lab-ambient transfer module to interface with one or more wet processing modules, where each of the transfer module and the one or more wet processing modules operate in a first ambient environment. The method also configures a vacuum transfer module to interface with one or more plasma processing modules, where each of the vacuum transfer modules and the one or more plasma processing modules operate in a second ambient environment. In addition, the method includes configuring a controlled ambient transfer module to interface with one or more plating modules, where each of the controlled ambient transfer module and the one or more plating modules operate in a third ambient environment. In accordance with the method, transitions are enabled between the first, second and third ambient environments within the cluster architecture, without being exposed to external uncontrolled ambient conditions.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 2A-2D6 illustrate example hardware, which may implement the controlled ambient processing, in accordance with one embodiment of the present invention.

DETAILED DESCRIPTION

Figure 1:
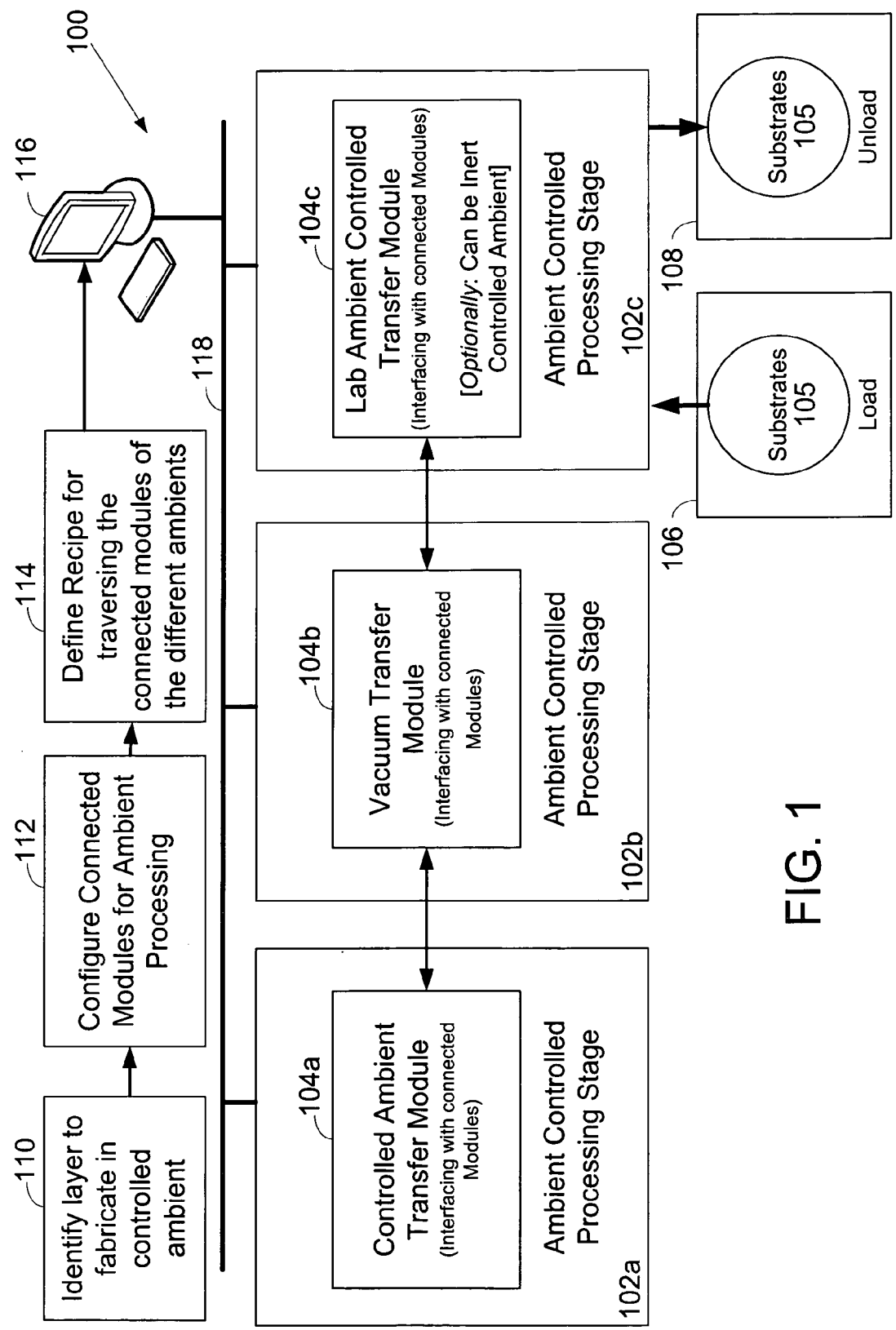
FIG. 1 shows an example system diagram, and the computer control that may manage the system for particular engineered fabrication operations, in accordance with one embodiment of the present invention.

Several exemplary embodiments are disclosed, which define example cluster architectures for processing substrates, and method for enabling the transitions among the modules of the cluster. The processing of substrates is performed in a controlled ambient environment during each stage of processing, as well as during transfers between one or more transfer modules. By providing an integrated cluster architecture, which defines and controls the ambient conditions between and, in disparate clustered systems, it is possible to fabricate different layers, features, or structures immediately after other processing in the same overall system, while preventing the substrate from coming into contact with an uncontrolled environment (e.g., having more oxygen or other undesired elements and/or moisture than may be desired). It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

One application, which can benefit from the controlled ambient conditions of the defined embodiments, is electroless deposition of metal layers, which is highly dependent upon the surface characteristics and composition of the substrate. For example, electroless plating of copper on a barrier metal, such as tantalum (Ta) or ruthenium (Ru) surface is of interest for both seed layer formation prior to electroplating, and selective deposition of copper (Cu) lines within a lithographically defined pattern.

The main problem, now overcome by the defined embodiments of the present invention, is the inhibition of the electroless deposition process by atomically thin native metal oxide layers formed in the presence of oxygen ($O_2$). Similar issues existed with selective capping on Cu lines, as well as other applications. An example layer/material is a cobalt-alloy capping layer, which may include CoWP (cobalt tungsten phosphide), CoWB (cobalt tungsten boride), or CoWBP (cobalt tungsten boro-phosphide). Capping layers are used to improve adhesion of dielectric barrier layers to the copper lines, and thus improve electro-migration performance of those lines.

Therefore, proper management of an engineered interface (e.g., surface preparation sequence prior to deposition) is critical. The engineered interface may be for a layer, features, or materials. Thus, preparing an atomically pure surface and maintaining a pure interface is facilitated by the ambient controlled architecture defined herein, which provides the appropriate surface preparation sequences in a controlled ambient manner. For example, in a CoWBP capping process, the electrolytic chemistry is formulated to provide selectivity of the deposition on exposed Cu over adjacent dielectric.

In some examples, the wafer surface and various interfaces prior to electroless plating are determined by the upstream processes, usually a CMP and post-CMP clean sequence. In both cases, galvanic effects and corrosion are controlled by passivating the Cu surface with BTA, forming a Cu-BTA complex. This metal-organic hybrid must be removed prior to plating, or plating will be inhibited. Additionally, the dielectric surface must be free of Cu and it's oxides, and the Cu surface must be free of Cu oxides. In one embodiment, these conditions are satisfied by the ambient controlled clustered modules, which prevent unwanted exposure to ambient conditions that may be counterproductive to the desired fabrication operation.

One example difference between prior art systems and those of the present invention, is that previous module clusters do not control the ambient at all times, both within the process chambers and within the transfer chambers, so that the interface remains controlled and stable from one process sequence to the next. Without a controlled ambient, the prepared interface can degrade or change almost instantaneously, even with minimal queue time.

With the above overview in mind, reference is now made to exemplary structure configurations, which will enable processing of substrates in a controlled ambient environment. FIG. 1 illustrates an ambient controlled cluster system 100, in accordance with one embodiment of the present invention. The ambient controlled cluster system 100 includes a number of ambient controlled processing stages 102a, 102b, and 102c. Each of these ambient controlled processing stages are interconnected in such a way that the ambient conditions in each of the stages is maintained, as well as controlled ambient transitions between the different stages. Each of these ambient controlled processing stages 102a-102c, may be viewed as first, second, and third ambient environments. The order of the first, second and third ambient environments is not a limitation, as transitions among the ambient environments is dictated by the specific chosen recipe and engineered sequence of traversal through the transfer modules and process modules.

In one embodiment, the ambient controlled cluster system 100 is configured to enable precise processing of a layer or feature of a semiconductor substrate, such as a semiconductor wafer. The layer or feature to be fabricated on a particular wafer will depend on the stage of processing. For example, the processing may be for front end of line (FEOL), back end of line (BEOL), or any processing sequence or steps in between. An example is now provided where the ambient controlled cluster system 100 is used to fabricate a layer or feature(s), in a controlled ambient environment.

In operation 110, a layer to fabricate is identified, so that the layer can be fabricated through the various stages 102 of the ambient controlled cluster system 100. Once the layer or feature has been identified in operation 110, an operation 112 is performed to configure connection of different modules, in each of the ambient controlled processing stages, to enable the desired processing. Each of the ambient controlled processing stages 102 will include a primary transfer module that will interface with locally connected processing modules. For example, ambient controlled processing stage 102c may include a lab-ambient controlled transfer module 104c, ambient controlled processing stage 102b may include a vacuum transfer module 104b, and ambient controlled processing stage 102a may include a controlled ambient transfer module 104a.

Each of the transfer modules 104 will therefore be interconnected with a controlled transition (e.g., load locks), and are configured to accept different processing modules for interconnection therewith, depending on the configuration required for processing a layer or feature, at a particular stage in the process. In operation 114, a recipe for traversing the connected modules of the different ambients is defined, and inputted to a user interface 116.

User interface 116 may be a computer having a screen and keyboard for communicating with the ambient controlled cluster system 100. The user interface 116 may be a networked computer that is connected to other system computers for remote interaction with the ambient cluster system 100. The user interface 116 will also enable users to input specific recipes defined in operation 114, for moving the substrate between the different transfer modules 104 and the process modules connected to each of the transfer modules 104. In a specific embodiment, the ambient controlled cluster system 100 will reside in a clean room environment, which will then be connected to facilities. The facilities of a clean room, as is known, will provide each of the ambient controlled processing stages 102 required fluids, gasses, pressures, cooling, heating, chemistries, and the like.

In this example, a load module 106 is configured to provide substrates 105 into the ambient controlled processing stage 102c, at the direction of code run at the user interface 116, which controls the transfer of substrates into the ambient controlled cluster system 100. An unload module 108 may receive substrates 105, that have been processed within the confines of the ambient controlled processing stages 102. Although the load module 106 and unload module 108 are illustrated at two separate modules, it should be understood that the load module and unload module may be the same type of module, or that substrates are sent from, and received by, the same load port module.

In one embodiment, the lab-ambient controlled transfer module 104 is configured to receive substrates 105. Once the substrates 105 are transmitted into the lab-ambient controlled transfer module 104c, the lab-ambient controlled transfer module 104c may operate at a pressure that is slightly above an uncontrolled ambient pressure, which may be present in the clean room.

In this manner, if the pressure is slightly higher in the lab-ambient control transfer module 104c, the interfacing of substrates 105 into and out of the lab-ambient controlled transfer module 104c, will cause a slight flow of air out of the lab-ambient controlled transfer module 104c. The slight flow of air out of the lab-ambient control transfer module 104c will ensure that particulates or other ambient air that may be present in the clean room does not filter into the lab-ambient controlled transfer module 104c, when a door or doors are open to transition the substrates 105 into and out of the lab-ambient controlled transfer module 104c.

In one embodiment, the lab-ambient controlled transfer module 104c may optionally operate in an inert controlled ambient. An inert controlled ambient is one that may pump out oxygen and replace the oxygen with an inert gas. Examples gases that can be pumped in to replace oxygen may be, for example, argon, nitrogen, and other gasses that will not negatively react with the processing. The inert controlled ambient, if optionally provided for the lab-ambient controlled transfer module 104c, may also be communicated to the processing modules connected thereto. For instance, any wet cleaning that is performed in modules connected to the lab-ambient controlled module 104c, will also be controlled in the inert controlled ambient.

The lab-ambient controlled transfer module 104c will therefore interface the substrates 105 that are moved into and out of various wet processing systems within the ambient controlled processing stage 102c, and enable transition of substrates processed in the ambient controlled processing stage 102c into a vacuum transfer module 104b. Transitions into the vacuum transfer module 104b will occur in a controlled manner through one or more load locks. Once a substrate resides within the vacuum transfer module 104b, the substrates 105 are allowed to move into and out of various plasma processing modules to enable desired processing. The vacuum transfer module 104b is also shown coupled to the controlled ambient transfer module 104a.

Transition of a substrate 105 between 104b and 104a will also be facilitated through one or more load locks, to ensure that the integrity of the vacuum transfer module pressure 104b remains, while enabling the substrate 105 to transition into an ambient that is controlled to avoid inappropriate exposure of just processed layers or features within 104, to be exposed to an ambient that may destroy are negatively alter such layers or features. In one example, when a substrate 105 that has been processed within the ambient controlled processing stage 102b, and is thus moved into the ambient controlled processing stage 102a, the feature or layer that has been plasma processed is not compromised by any uncontrolled exposure to an ambient that may damage or chemically alter the just processed feature or layer.

As an example, the controlled ambient transfer module 104a will operate in an inert ambient. As noted above, an inert ambient is one that is pumped with an inert gas, which should deplete or reduce the existence of most oxygen within the ambient controlled processing stage 102a. As an example, a level of oxygen that is acceptable and still viewed as substantially oxygen free may be 3 ppm. (parts per million), or less. Some processes may require less than 1 ppm control after a surface treatment prior to and during subsequent processing. By configuring the inert environment within the ambient controlled processing stage 102a, it is possible to avoid oxidation or hydroxylation of features or layers that may have been just fabricated within the ambient controlled processing stages 102b or 102c. Within the controlled ambient transfer module 104a, various processing modules will allow the controlled deposition, coating, plating, or processing of a layer or features over the substrate 105, without having any intermediate oxidation of layers or features. As such, the layer that is formed within the controlled ambient transfer module processing stages is controlled, and in one embodiment, is said to be "engineered" to avoid unnecessary formation of oxides, which may reduce the performance of the processed layer or feature(s).

At this point, the substrate 105 may be moved back into the vacuum transfer module 104b for further processing with a plasma processing module, or back to the lab-ambient control transfer module 104c, for additional processing within modules connected thereto. The specific processes of moving the substrate 105 between any of the ambient control processing stages 102a, 102b, and 102c, will be dependent upon the defined recipe identified in operation 114, which is controlled by a program executed on a computer connected to the user interface 116.

Figure 2A:
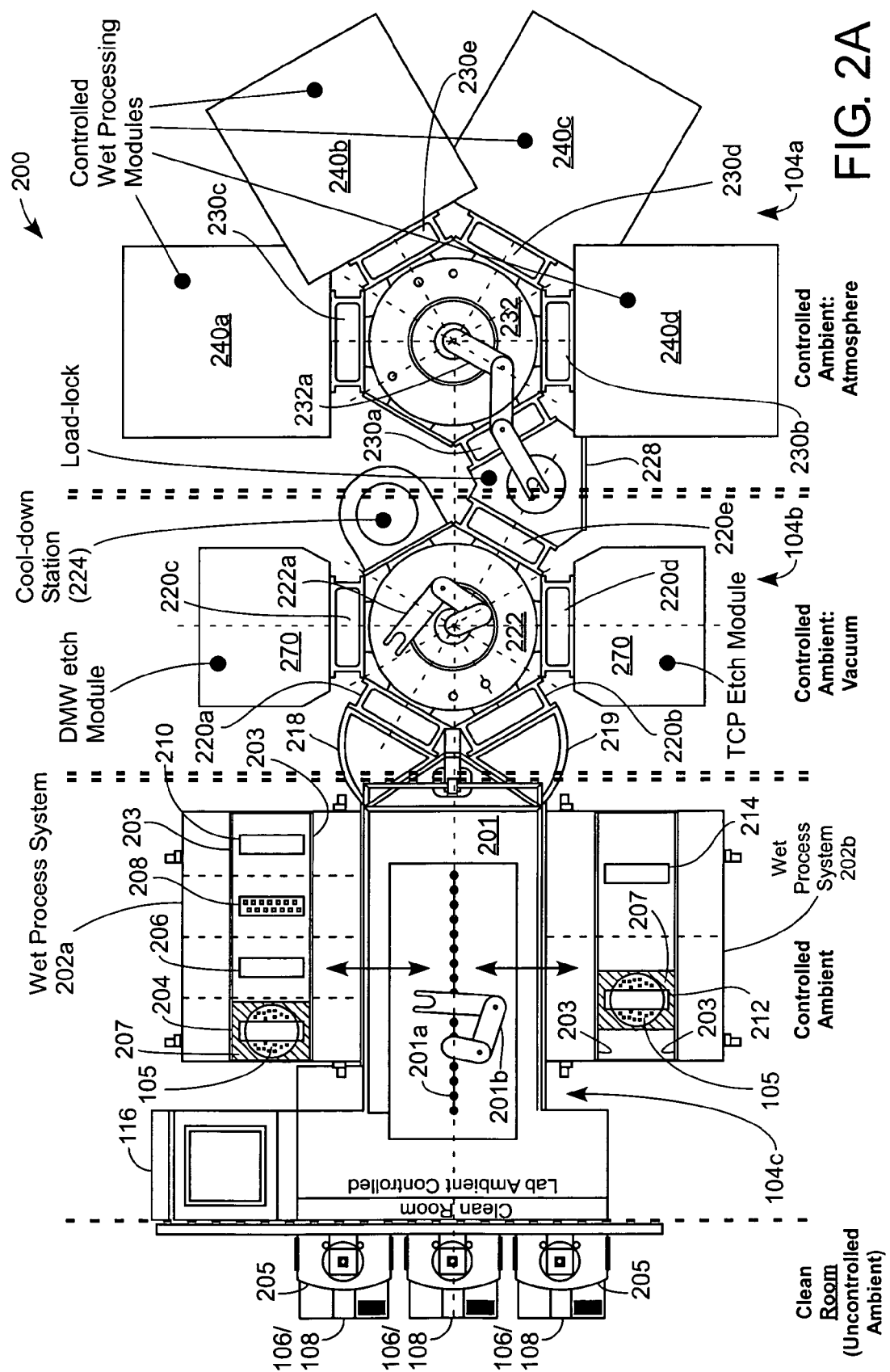

FIG. 2A illustrates a cluster architecture 200 that includes a number of transfer modules and processing modules connected thereto. The cluster architecture 200 is one example of specific processing modules that may be connected to the various transfer modules in the ambient controlled processing stages 102a, 102b, and 102c.

The cluster architecture 200 will be explained from left to right, where substrates can be loaded and unloaded in the load modules 106 and unload modules 108. As discussed above, the load modules 106 and unload modules 108 may be generally referred to as load-unload stations that may be configured to receive cassettes 205, that hold one or more wafers. The cassettes 205 may be contained within Front Opening Unified Pods (FOUPs) that are used to transport wafers around a clean room. The handling of FOUPs that hold cassettes 205 may be automated or manually handled by human operators. The substrates 105 will therefore be contained within the cassettes 205 when delivered to the cluster architecture 200, or received from the cluster architecture 200. As defined herein, the clean room is the uncontrolled ambient in which the cluster architecture 200 sits or is installed.

The lab-ambient controlled transfer module 104c is defined by a stretch transfer module 201, that includes one or more end effectors 201b. The illustrated end effector 201b is capable of traversing the stretch transfer module 201 when moved along a track 201a. In one embodiment, the stretch transfer module 201 is kept at a standard clean room pressure. Alternatively, the pressure may be controlled to be slightly above the ambient pressure of the clean room, or slightly below the pressure of the clean room.

If the pressure within the stretch transfer module 201 is kept at a pressure slightly above the clean room, transitions of wafers into and out of the stretch transfer module will cause a slight outgas of the transfer module ambient into the clean room. This configuration may thus prevent particulates or the environment air within the clean room to flow into the stretch transfer module 201.

In other embodiments, the transition between the stretch transfer module 201 and the clean room will be controlled by appropriate filters and air handling units that will define a curtain or interface of air and/or environment, so as to prevent interaction of the ambient air between the clean room and the stretch transfer module 201. An example of a system for controlling the interface is defined in U.S. Pat. No. 6,364,762, entitled "Wafer Atmospheric Transport Module Having a Controlled Mini-Environment", which issued on Apr. 2, 2002, to the assignee of the present application, and is herein incorporated by reference.

The stretch transfer module 201 is shown interfaced with wet processing system 202a and wet processing system 202b. Each of wet processing systems 202 may include a number of sub-modules, within which substrate 105 may be processed. In one example, a carrier 207 is allowed to move along a track 203 within the wet process systems 202a. The carrier 207 is configured to hold the substrate 105, as it is processed in each of the sub-modules of the wet processing system 202. In one example, the wet processing system 202a will include a proximity station 204, followed by a proximity station 206, followed by a brush station 208, and then a final proximity station 210.

The number of sub-modules within the wet processing system 202a are dependent on the particular application and the number of wet processing steps desired to be performed on a particular substrate 105. Although four sub-modules are defined in wet processing system 202a, an example of two sub-modules within the wet processing system 202b is provided. The proximity station 204 is composed of a proximity head system which utilizes a meniscus to apply and remove fluids onto a surface of the substrate 105, as the substrate 105 is caused to move along the track 203, so that the meniscus can be applied over the entire surface of the substrate 105.

In specific embodiments, the proximity stations may be configured to apply DI water for simple cleaning, HF (hydrofluoric acid), ammonia-based cleaning fluids, standard clean 1 (SC1), and other etching and cleaning chemicals and/or fluid mixtures. In a specific embodiment, the proximity stations will include proximity heads that will process both top and bottom surfaces of the substrate 105. In other examples, only a top surface may be processed by a proximity head while the bottom surface may be unprocessed, or processed by a brush station roller. The combination of processing operations performed within the wet processing system's 102a will therefore vary, depending upon the processing required for a particular substrate in its recipe of fabrication.

It will be understood that the stretch transfer module 201 is configured to allow substrates 105 to be moved into and out of either particular sub-modules within the wet processing system 202, or into a single processing sub-module of the wet processing system 102a and then removed at the end of the line of the wet processing system 201. For additional throughput, the wet processing system 201 is provided such that one system is coupled to each side of the stretch transfer module 201. Of course, the lab-ambient control transfer module defined by the stretch transfer module 201, may include fewer or more wet processing systems, depending upon the throughput required, available lab footprint or facilities, and/or processing required.

The stretch transfer module 201 is shown coupled to load locks 218 and 219. The load locks 218 and 219 are configured to allow transition from one pressure state to another in a controlled manner between the stretch transfer module 201 and a vacuum transfer module 222. The vacuum transfer module 222 will include an end effecter robot 222a. The end effecter 222a is configured to reach into and out of the load locks 218 and 219 when access is provided by slot valves 220a and 220b. The slot valves will house a door or multiple doors that allow opening and closing of the vacuum transfer module 222, so that the pressure within the vacuum transfer module is uninterrupted. Thus, the doors of the slot valves 220a and 220b enable transitions between the load locks 218 and 219, which serve to control the transfer between the stretch transfer module 201 and the vacuum transfer module 222 which may be at different pressure states.

The vacuum transfer module 222 is also shown interfaced with plasma modules 270, by way of slot valves 220c and 220d. The plasma modules 270 may be of any type, but a specific example may be a TCP etch module and a downstream microwave etch module. Other types of plasma modules may also be incorporated. Some plasma modules may include types of deposition modules, such as plasma vapor deposition (PVD), atomic layer deposition (ALD), etc. Thus, any dry processing modules that removes or deposits material onto the surface or surfaces of a substrate may be incorporated and connected to the vacuum transfer module 222.

Alternatively, thermal process modules can be used in addition, or in place of, plasma processing modules. In this case, it may be advantageous to operate the vacuum transfer module 222 at higher pressure, up to 400 torr, for example, to facilitate interface with the thermal modules.

If processing is performed in one of the plasma modules 270, the vacuum transfer module may incorporate a cool-down station 224. The cool-down station 224 is particularly beneficial when a substrate has been cooled to a point before transition into one of the neighboring controlled ambient stages. Once a substrate is cooled, if needed, the substrate may be moved into a load lock 228 by the end effecter 222*a*, for then transitioning into a controlled ambient transfer module 232. The controlled ambient transfer module 232 is interconnected with load lock 228 by way of slot valve 230*a*.

The controlled ambient transfer module 232 is shown interconnected with a number of process modules 240*a*, 240*b*, 240*c*, and 240*d*, through associated slot valves 230*b*, 230*c*, 230*d*, and 230*e*. The processing modules 240, in one embodiment, are controlled ambient wet processing modules. The controlled ambient wet processing modules 240 are configured to process a surface of a wafer in a controlled inert ambient environment. The controlled inert ambient environment, as noted above, is configured such that an inert gas is pumped into the controlled ambient transfer module 232, and oxygen is purged out of the controlled ambient transfer module 232.

By removing all or most of the oxygen from the controlled ambient transfer module 232 and replacing it with an inert gas, the controlled ambient transfer module 232 will provide a transition environment which does not expose a just process substrate (e.g., within a plasma module 270) before a layer is either deposited, plated, or formed onto a processed surface or feature in one of the process modules 240. In specific embodiments, the processed modules 240 may be electroplating modules, electroless plating modules, dry-in/dry-out wet process modules, or other types of modules that will enable the application, formation, or deposition of a layer on top of a surface or feature that has been just processed in a prior plasma module.

Additionally, the vacuum transfer module and the controlled ambient transfer module can be configured to be integrated in reverse order to facilitate other process sequences.

The result is an engineered layer that is formed directly over a surface that has just been processed, and does not contain oxides that are typically formed when even minor exposure to oxygen occurs before a layer is plated thereon. In one specific example, a dielectric layer may be etched to define a via and/or trench within plasma modules 270, and immediately after the vias or trenches are defined in the dielectric layer, a transfer occurs between the vacuum transfer module 222 through load lock 228 and into the controlled ambient transfer module 232. This transfer occurs without or substantially without exposure to oxygen. In some processes, a barrier layer may be fabricated directly over the surface of the engineered interface. The barrier layer may include, for example, Ta, TaN, Ru, or combinations of these materials etc. The barrier layer may be used for electroless plating of Cu as a seed layer or to plate directly on a patterned substrate. For more information on direct plating, reference can be made to: (1) U.S. patent application Ser. No. 11/382,906, filed on May 11, 2006, and entitled "PLATING SOLUTION FOR ELECTROLESS DEPOSITION OF COPPER", (2) U.S. patent application Ser. No. 11/427,266, filed on Jun. 28, 2006, and entitled "PLATING SOLUTIONS FOR ELECTROLESS DEPOSITION OF COPPER," (3) U.S. patent application Ser. No. 11/639,012, filed on Dec. 13, 2006, and entitled "SELF ASSEMBLED MONOLAYER FOR IMPROVING ADHESION BETWEEN COPPER AND TANTALUM," (3) U.S. patent application Ser. No. 11/591,310, filed on Oct. 31, 2006, and entitled "METHODS OF FABRICATING A BARRIER LAYER WITH VARYING COMPOSITION FOR COPPER METALLIZATION," AND (4) U.S. patent application Ser. No. 11/552,794, filed on Oct. 25, 2006, and entitled "APPARATUS AND METHOD FOR SUBSTRATE ELECTROLESS PLATING," each of which is incorporated herein by reference.

Figure 2B:
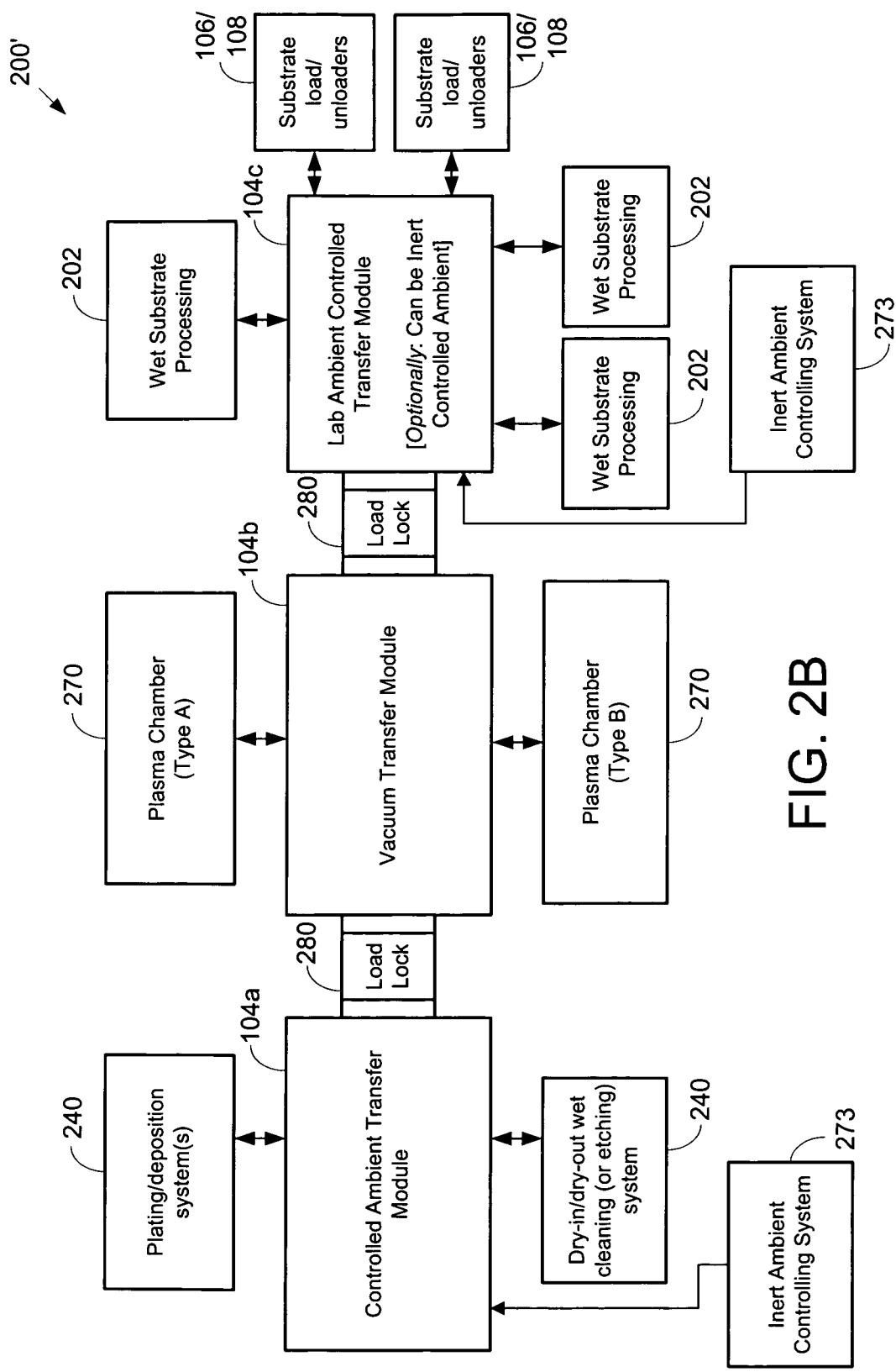

FIG. 2B illustrates a block diagram of potential processing modules that may be connected to the various transfer modules in a cluster architecture 200'. In this example, load and unload stations 106/108 are provided to introduce or receive substrates between the cluster architecture 200' and a clean room. Substrates are introduced into lab-ambient controlled module 104*c* where wet substrate processing may be performed. The wet substrate processing and the transfer of the substrate within the lab-ambient control transfer module is configured to occur in a controlled environment, that ensures that wet substrate processing can be performed in a controlled manner which does not expose the substrates to the uncontrolled ambient of a clean room.

The lab-ambient control transfer module is configured to introduce substrates in a dry condition into each of the wet substrate processing modules and receive substrates in a dry condition after being processed by the wet substrate processing. In this embodiment, the wet substrate processing is configured to employ a meniscus proximity head system that enables the formation of fluids directly on the surface of a substrate, and leave a surface dry once the substrate surface has been processed. A load lock 280 is configured to ensure ambient control between a transfer between the lab-ambient control transfer module 104*c* and the vacuum transfer module 104*b*.

The vacuum transfer module 104*b* is configured to interface with plasma chambers 270 of different types. The processing performed in the plasma chambers may depend on the particular process, but processing that is required after plasma chamber processing may then be immediately performed in either one of the adjacent controlled ambient stages 102. In one example, a wafer may be moved from the vacuum transfer module 104*b* through load lock 280, and into the controlled ambient transfer module 104*a*. The controlled ambient transfer module will therefore maintain efficient transfers between the different plating or deposition systems 240, and/or systems that perform dry-in and dry-out wet cleaning (or etching).

Still another example module that may be connected to the controlled ambient transfer module 104*a* is a supercritical CO2 chamber. In other embodiments, thermal-type chambers can be integrated into any one of the transfer modules, depending on the process requirements. For instance, one chamber may be supercritical chamber. The chamber may also be an electroless plating chambers that can deposit cobalt capping, copper seed layers, metallic layers, barrier layers, bulk metal fill layers, and other conductive features, surfaces, interconnects, traces, etc. Electroless plating chambers, in one embodiment of the present invention, do not require electrodes (e.g., anode/cathodes), but does use reactive chemistry that is surface-active. In still another embodiment, the vacuum transfer module may be connected to only thermal controlled chambers. In some cases, higher pressure chambers can be connected if the vacuum transfer module is operated in a pressure range of between about 200-400 Torr.

Also illustrated are inert ambient controlling systems 273, which are configured to couple to the transfer modules. The inert ambient controlling systems 273, in one embodiment, includes pumps, gauges, controls and valves that meter and control the pumping of oxygen out of the transfer modules. Clean room facilities (not shown) may also couple to the inert ambient controlling systems 273, so that inert gas can be pumped into the transfer chambers, which thus replaces the spaces previously occupied by oxygen. The pumps that remove the oxygen and the inert gases that are fed into the transfer chambers will be monitored, so that proper setting of conditions can be maintained during operation. In some examples, the pumps will have to work to also remove the oxygen from the processing modules, so that the inert environment can be maintained in both the transfer modules and the process modules. Again, meters, manual control and/or computer control can monitor and adjust the pumping and flows of inert gases, such as $N_2$, Ar, He, Ne, Kr, Xe, etc.

For the controlled ambient modules that are also inert ambient controlled, the temperatures with the transfer modules and the process modules will vary, depending on the type of processing being performed. However, for example purposes, the lab-ambient controlled transfer module 104c and the wet substrate processing stations 202 may operate at a temperate of between about 15 C and about 30 C. The humidity may also be controlled within the controlled transfer module 104c and the wet substrate processing stations 202, and the humidity may be controlled to be between about 0% and about 20%.

The vacuum transfer module 104b may operate at a pressure of between about $10^{-9}$ and about $10^{-4}$ Torr, and operating temperatures may be between about 15 C and about 30 C. The plasma processing modules operate in temperate ranges, power ranges, and use process gases that are tailored to a particular process, and as such, any processing condition that is compatible with the vacuum state of the vacuum transfer module 104 will work. Other parameters, for example may include vacuum, temperature and power. Vacuum, in one embodiment, can be about 1 mT to about 10 T. Temperature, in one embodiment, can be about 10 C to about 400 C. Power, in one embodiment, can be about 10 W to about 3000 W.

The controlled ambient transfer module 104a (e.g., the transfer module 232 of FIG. 2A), may operate at a pressure of between about 500 T and about 800 T, and the temperature may be between about 15 C and about 30 C. However, the temperature may be controlled so as to provide compatibility with plating, dry-in and dry-out wet processes, supercritical CO2 operations, etc., which may be processed modules 240. In one embodiment, the temperature of the transfer modules are set at the ambient lab temperature, and local temperature control is provided by the process modules. In another embodiment, the transfer modules may be temperature controlled to maintain a consistent ambient when wafers transition between process modules and the transfer modules.

The system of FIG. 2B was provided to illustrate the modularity, yet control of interfaces of the substrate between the various controlled environments. Also, it should be understood that the modularity of each of the transfer modules and its acceptance of different sub-modules for processing are many, and only exemplary processing modules interface with the different ambient controlled transfer modules are provided for ease of illustration.

Figure 2C:
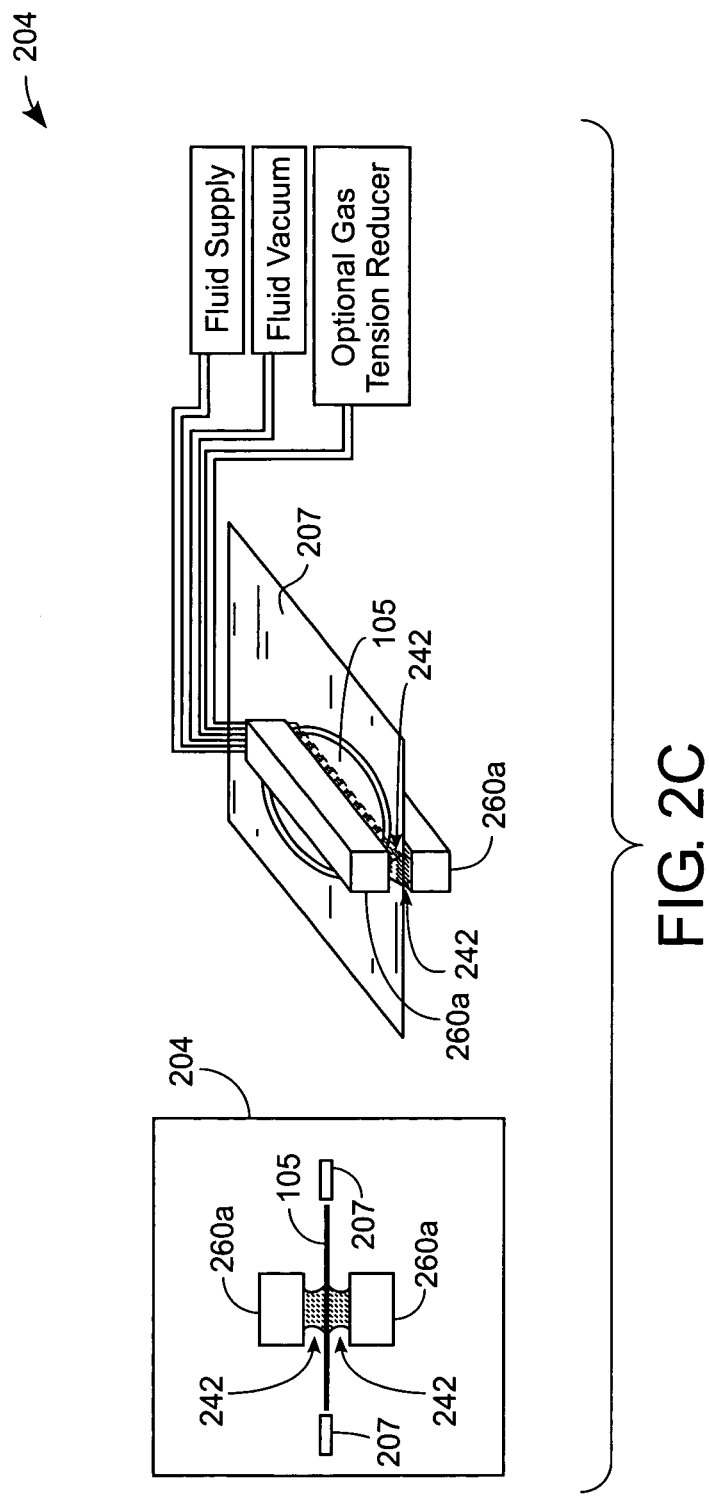

FIG. 2C illustrates exemplary configurations of a proximity station 204 as discussed with reference to FIG. 2A. The proximity station 204 will include a proximity head 260a on a top side and a bottom side of the substrate 105. The substrate 105 will be held by a carrier 207 that is allowed to move along a track 203, as defined in FIG. 2A. Between a surface of the proximity head 260a and the surface of the substrate 105 (and surfaces of the carrier 207) a meniscus 242 is allowed to form.

The meniscus 204 may be a controlled fluid meniscus that forms between the surface of a proximity head 260a and a substrate surface, and surface tension of the fluid holds the meniscus 242 in place and in a controlled form. Controlling the meniscus 242 is also ensured by the controlled delivery and removal of fluid, which enables the controlled definition of the meniscus 242, as defined by the fluid. The meniscus 242 may be used to either clean, process, etch, or process the surface of the substrate 105. The processing on the surface 105 may be such that particulates or unwanted materials are removed by the meniscus 240.

As noted, the meniscus 240 is controlled by supplying a fluid to the proximity heads 260a while removing the fluid with a vacuum in a controlled manner. Optionally, a gas surface tension gradient reducer may be provided to the proximity heads 260a, so as to reduce the surface tension between the meniscus 242 and the substrate 105. The gas tension reducer supplied to the proximity heads 260a allows the meniscus 242 to move over the surface of the substrate 105 at an increased speed (thus increasing throughput). An examples of a gas tension reducer may be isopropyl alcohol mixed with nitrogen (IPA/$N_2$). Another example of a gas tension reducer may be carbon dioxide (CO2). Other types of gases may also be used so long as the gas does not interfere with the processing desired for the particular surface of the substrate 105.

For more information on the formation of the meniscus 242 and the application to the surface of a substrate, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,998,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,998,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the subject application, and each is incorporated herein by reference.

FIGS. 2D-1 through 2D-6 are provided to convey examples of different configurations that may be incorporated within either the wet processing systems 202 of FIG. 2A, or the controlled ambient wet processing modules 240 of FIG. 2A. Although these specific examples are provided, it should be understood that other configurations may be included within the system.

FIG. 2D-1 illustrates an example of a proximity head 260a processing a top surface of a substrate 105 while a brush 290 processes a bottom surface of the substrate 105. The processing may be performed within the wet processing system 202 and can be configured to either clean or etched the surface of the substrate 105.

FIG. 2D-2 provides an example where a bottom brush 290 and a top brush 290 is configured to process the surfaces of the substrate 105. The brushes used may be polyvinyl alcohol (PVA) brushes that may provide fluids to the surface of the substrate 105 while rotating. The fluids provided by the brushes 290 may be provided through the brush (TTB) core and the fluids may be for cleaning, and/or etching, and/or configuring the surface of the substrate to be either hydrophobic or hydrophilic, depending on the application.

Figure 3:
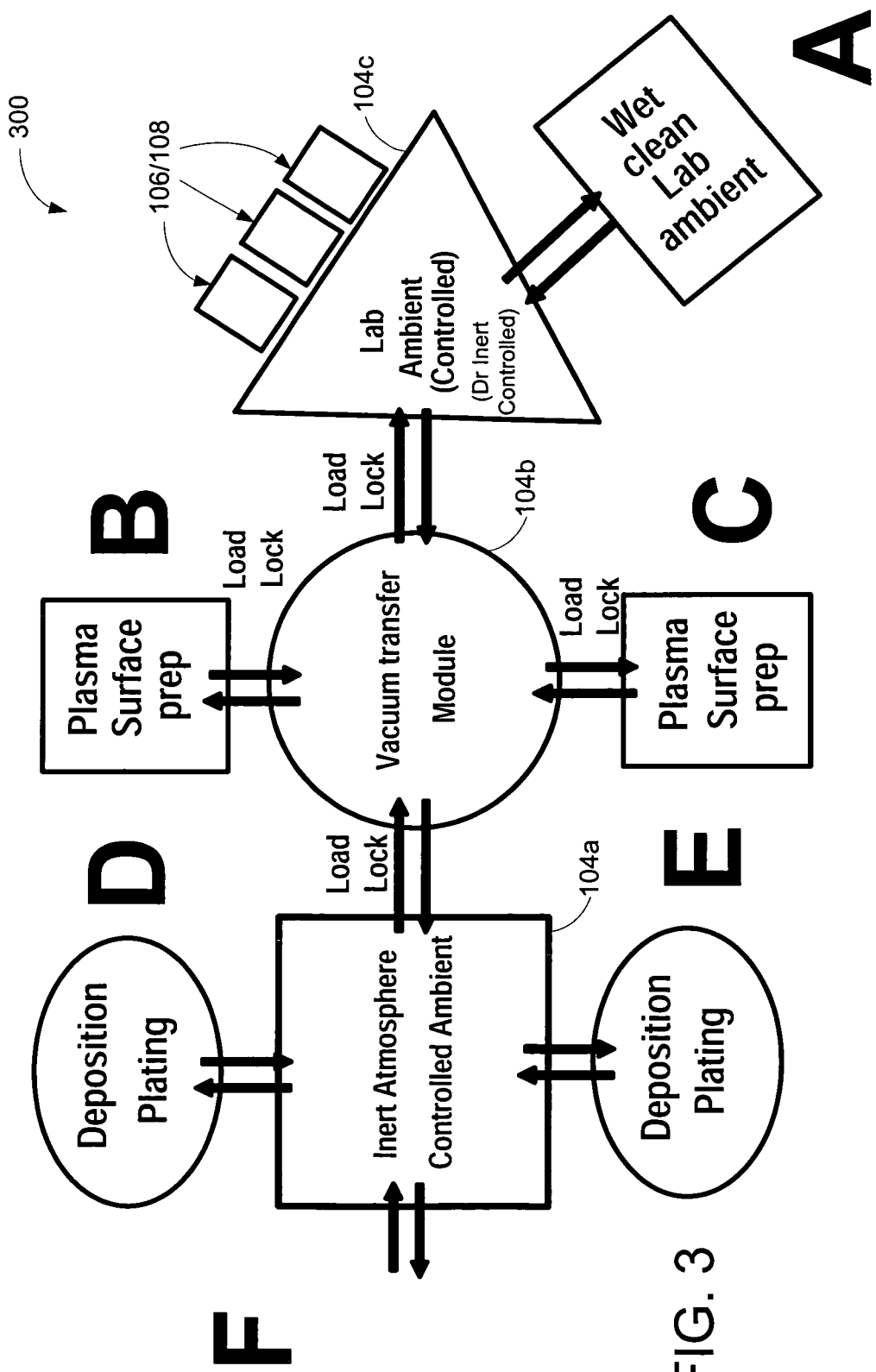
FIGS. 3-4 illustrate an example process flow, which may be facilitated by the controlled ambient execution of transitions among transfer modules and process modules, in accordance with one embodiment of the present invention.

FIG. 2D-3 illustrates an example where the processing module 240, that may be connected to the controlled ambient transfer module 232 of FIG. 2A, is a plating system. The plating system may be configured as an electroless plating system, or an electroplating system where contacts with the wafer are required. The configuration of the plating head 260b can take on a number of forms, and a specific form of the plating head will change, depending on the type of plating application being performed. The result of the plating application is to leave a plated surface 292 on the surface of the substrate 105. The plated surface may result in a deposited copper layer, or other metallic layer, that may need to be plated on a surface of a substrate at a particular stage of fabrication.

Example systems and processes for performing plating operations are described in more detail in: (1) U.S. Pat. No. 6,864,181, issued on Mar. 8, 2005; (2) U.S. patent application Ser. No. 11/014,527 filed on Dec. 15, 2004 and entitled "WAFER SUPPORT APPARATUS FOR ELECTROPLATING PROCESS AND METHOD FOR USING THE SAME"; (3) U.S. patent application Ser. No. 10/879,263, filed on Jun. 28, 2004 and entitled "METHOD AND APPARATUS FOR PLATING SEMICONDUCTOR WAFERS"; (4) U.S. patent application Ser. No. 10/879,396, filed on Jun. 28, 2004 and entitled "ELECTROPLATING HEAD AND METHOD FOR OPERATING THE SAME"; (5) U.S. patent application Ser. No. 10/882,712, filed on Jun. 30, 2004 and entitled "APPARATUS AND METHOD FOR PLATING SEMICONDUCTOR WAFERS"; (6) U.S. patent application Ser. No. 11/205,532, filed on Aug. 16, 2005, and entitled "REDUCING MECHANICAL RESONANCE AND IMPROVED DISTRIBUTION OF FLUIDS IN SMALL VOLUME PROCESSING OF SEMICONDUCTOR MATERIALS"; and (7) U.S. patent application Ser. No. 11/398,254, filed on Apr. 4, 2006, and entitled "METHODS AND APPARATUS FOR FABRICATING CONDUCTIVE FEATURES ON GLASS SUBSTRATES USED IN LIQUID CRYSTAL DISPLAYS"; each of which is herein incorporated by reference.

FIG. 2D-4 illustrates another example of a plating system, where two plating heads are used to plate a surface of the substrate 105. In this example, one plating head 260b is used as the actual plating head while another plating head 260b is used as a facilitator head. The facilitator head will provide the electrical link that is required to define anode-cathode connections, for plating a metallic material onto a surface of a substrate. For more information on types of system, heads and processes for plating and facilitating, reference may be made to U.S. patent application Ser. No. 10/607,611, entitled "APPARATUS AND METHOD FOR DEPOSITING AND PLANARIZING THIN FILMS OF SEMICONDUCTOR WAFERS", filed on Jun. 27, 2003, which is herein incorporated by reference.

FIG. 2D-5 illustrates another example of a head 260c which may be used in the wet processing system 202. The wet processing system 202 may include the formation of one or more Newtonian fluids over the surface of the substrate 105. An example of a non-Newtonian fluid is a soft condensed matter which occupies a middle ground between the extremes of a solid and a liquid. The soft condensed matter is easily deformable by external stresses, and examples of the soft condensed matter include emulsions, gels, colloids, foam, etc. It should be appreciated that an emulsion is a mixture of immiscible liquids such as, for example, toothpaste, mayonnaise, oil in water, etc. A colloid is a polymer dispersion in water, and gelatin is an example of a colloid. Foam is comprised of gas bubbles defined in a liquid matrix, and shaving cream is an example of one type of foam. In this example, a non-Newtonian fluid 294 is illustrated as applied by a head 260c.

For additional information regarding the functionality and constituents of Newtonian and non-Newtonian fluids, reference can be made to: (1) U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME"; (2) U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and (3) U.S. patent application Ser. No. 11/154,129, filed on Jun. 15, 2005, and entitled "METHOD AND APPARATUS FOR TRANSPORTING A SUBSTRATE USING NON-NEWTONIAN FLUID," each of which is incorporated herein by reference.

Another material in one of the wet chambers of the ambient control modules is a tri-state body. A tri-state body is one which includes one part gas, one part solid, and one part fluid. For additional information about the tri-state compound, reference can be made to Patent Application No. 60/755,377, filed on Dec. 30, 2005 and entitled "METHODS, COMPOSITIONS OF MATTER, AND SYSTEMS FOR PREPARING SUBSTRATE SURFACES." This Patent Application was incorporated herein by reference.

The head 260c may also be incorporated with inputs and outputs for providing combined Newtonian fluids along with the non-Newtonian fluids. For examples of these combinations, reference may be made to U.S. patent application Ser. No. 11/704,435, entitled "METHOD AND APPARATUS FOR CONTAINED CHEMICAL SURFACE TREATMENT," filed on Feb. 8, 2007, and is herein incorporated by reference.

FIG. 2D-6 illustrates a substrate 105 that is held by rollers 296. Rollers 296 allow the substrate to move in a rotational manner, while a head 260c is used to apply a non-Newtonian fluid (e.g., a foam-like material), to the surface of a substrate in a controlled manner. The non-Newtonian fluid may be provided to the head and also removed by the head in a controlled manner, such that the surface of the substrate is rendered clean. In another embodiment, the non-Newtonian fluid may be applied by the head 260c and allowed to remain on the surface of the substrate for a period of time, where a nozzle may be used to spray the surface of the substrate while the substrate rotates using the rollers. Still other examples not provided by illustration may include SRD (spin rinse and dry) modules, and other commonly used processing systems that are either wet or dry. All of these modules, when connected to the transport modules, are maintained in a controlled ambient and dry wafers are loaded into the module and removed from the module after processing is complete.

Figure 4:
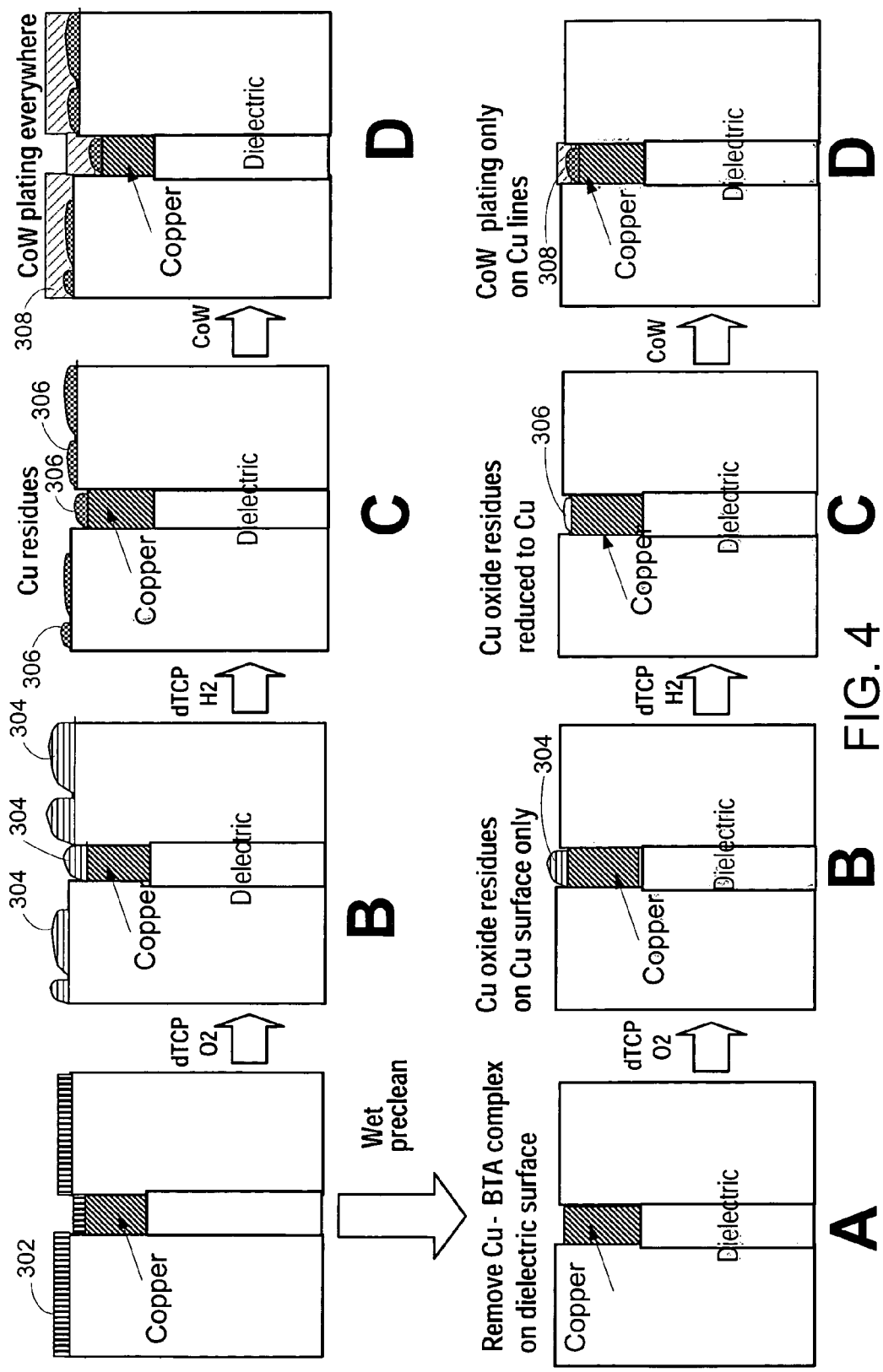

FIG. 3 illustrates an exemplary flow process from A to D, in accordance with one embodiment of the present invention. The flow process 300 of FIG. 3 will be described with exemplary fabrication of a CoWBP (cobalt tungsten boro-phosphide) capping operation over a selected surface of an exposed copper material. In FIG. 4, the process illustrates two potential process flows that can be performed; one with a preferred outcome and one with an un-preferred outcome.

When performing a CoW (BP) capping process, and electrolytic chemistry is formulated to provide selectivity for deposition onto exposed copper over adjacent dielectric. The wafer surface and various interfaces, prior to electroless plating, are determined by the upstream processes. These upstream processes are usually chemical mechanical polishing (CMP) and post-CMP clean sequences. In both cases, galvanic effects and corrosion are controlled by passivating the copper surface, typically with BTA, forming a Cu-BTA complex.

In FIG. 4, the top left figure illustrates a dielectric material that includes a copper feature and the result of a CMP and/or clean operation which produces a Cu-BTA complex 302. This metal-organic hybrid must be removed prior to plating, or plating will be inhibited. Additionally, the dielectric surface must be free of copper and its oxides, and the copper surface must be free of copper oxides. In one operation, the substrate having the Cu-BTA complex 302 is processed by a wet pre-clean operation to remove the Cu-BTA complex on the dielectric surface.

This operation is illustrated in operation A in FIGS. 3 and 4. In one specific example, a cleaning chemistry, which may be tetramethylammonium chloride (TMAH), is used to substantially remove all of the Cu-BTA complex 302. TMAH is described as one example only, and it should be understood that other chemistries may be used, depending on the layer that is to be removed in the pre-clean operation. In one embodiment, operation A is performed by a cleaning module that is part of the lab-ambient controlled transfer module 104c. If the Cu-BTA complex 302 is not removed from the surface using the pre-clean operation in A, the method could traverse path B, C, and D illustrated in the top portion of FIG. 4.

Traversing operations B, C, D in the top portion of FIG. 4 will result in having a copper tungsten plating cap over the entire surface of the substrate, including portions of the dielectric that are not the target of selected plating (or deposition). As such, one embodiment of the present invention will illustrate the benefits of using the controlled ambient system to process operations A, B, C, and D as illustrated in the bottom row of FIG. 4.

In operation B, a downstream TCP operation is performed with an oxygen environment so as to oxidize and remove any remaining organic contaminants; any exposed copper will also be oxidized during this step. The oxidized copper residues 304 on the copper surfaces will remain as illustrated in B. If, however, the wet pre-clean had not been performed, the copper oxide residues would also remain on the top surfaces of the dielectric material and not just over the top of copper lines, as desired in this example flow.

Operation B, is preferably performed in one of the plasma modules connected to the vacuum transfer module 104b and a next operation is performed in another plasma module connected to the vacuum transfer module 104b. In this example, a next downstream TCP H2 operation is performed so as to cause a reduction operation of the copper, as illustrated by layer 306. The bottom part of FIG. 4 illustrates the preferred flow, where only the copper oxide residues are reduced over the copper line. The top row illustrates where the copper residues are reduced over the dielectric layer. Optionally, operation B and C can be performed using a thermal process of Oxygen at elevated temperatures, followed by Hydrogen at elevated temperatures (150 to 400 C).

Once operations B and C are performed, a transition may occur between C and D, as shown in FIG. 3. The transition will enable transfer of the substrate from the vacuum transfer module through a load lock and into an inert atmosphere controlled ambient. The inert atmosphere controlled ambient is designed such that it is substantially free of oxygen, which will prevent undue oxidation of the surfaces before being processed within the modules connected to the inert atmosphere controlled ambient of FIG. 3.

In operation D, the selective CoW cap plating may now occur only over the copper features, without forming the CoW plating over undesired regions, as shown in the upper part of FIG. 4 (operation D). Plating of the CoW over the copper selectively is facilitated due to autocatalytic surface characteristics of the copper, which enable the selective plating of the CoW only over the copper regions and not over the clean dielectric layers. This example has been provided to illustrate ways of depositing a CoW plating cap over exposed copper features, but many more fabrication operations are possible within the cluster architecture, which enables transfers and processing in a controlled ambient.

Figure 5:
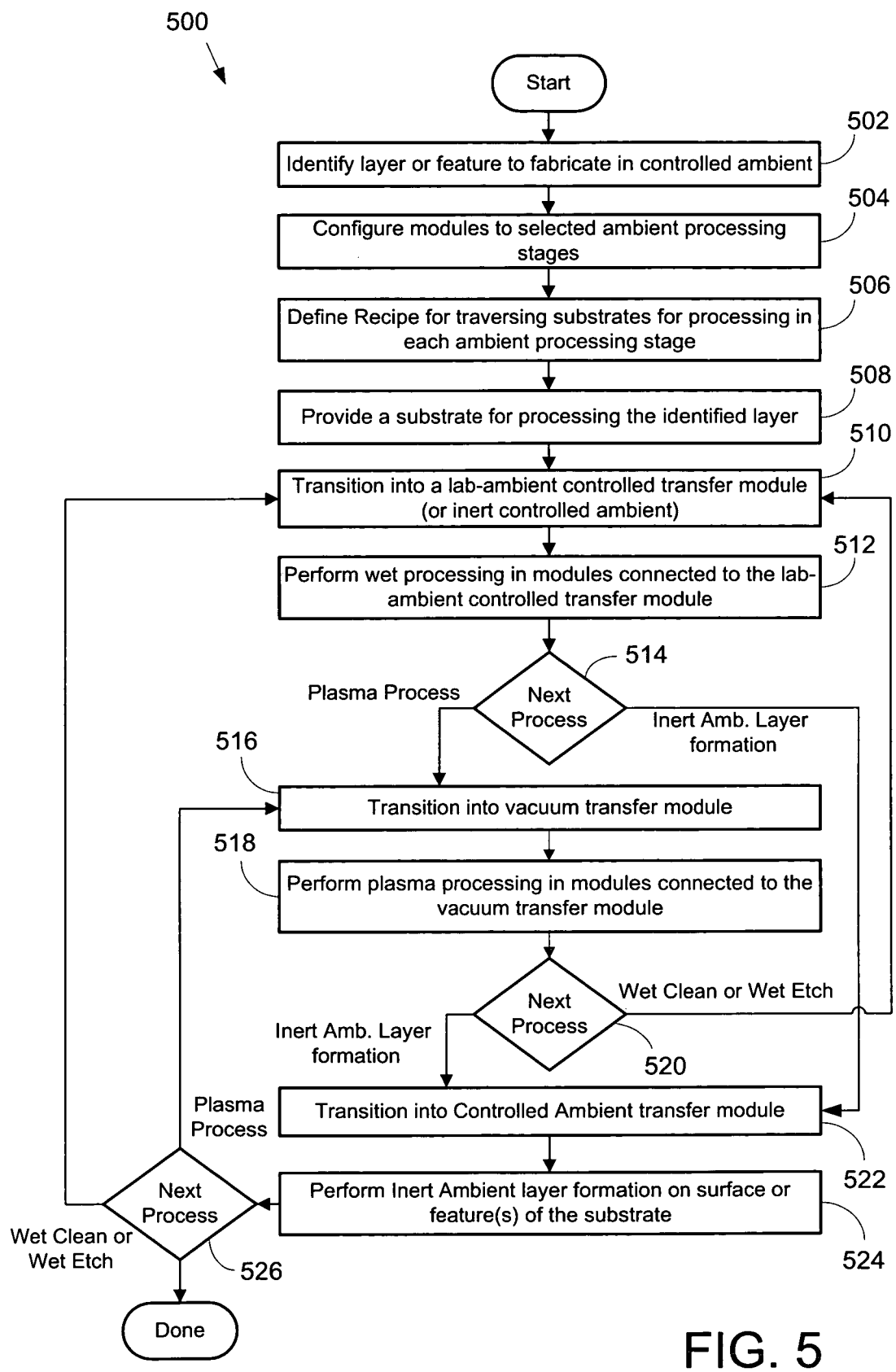
FIG. 5 illustrates an example flow diagram, which may be executed in making decisions on process transitions among the processing regions of the ambient controlled modules, in accordance with one embodiment of the present invention.

FIG. 5 illustrates a flow diagram 500, which defines the configuration of modules in a cluster architecture and control of substrates within the modules, so that transitions between the different modules are performed in a controlled ambient environment. As noted above, a difference from prior art modules is that the defined system enables the control of ambient at all times, both within the process chambers and within the transfer modules, so that the interface (i.e., layers, features, etc.) remain controlled and stable from one process sequence to the next. Without a controlled ambient, the prepared interface can degrade or change almost instantaneously even with minimal queue time, as may be the case in prior art systems.

The method operations of FIG. 5 may begin at operation 502 where a layer or feature to fabricate in a controlled ambient is identified. In one embodiment, specific layers may be fabricated, such as barrier layers, liners, seed layers, or bulk deposition of copper. In other embodiments, only certain features may be fabricated, such as done in selective plating operations, typically, implemented using electro and electroless plating systems. Once the layer or feature has been identified in operation 502, the method moves to operation 504 where modules are connected to selected ambient processing stages. The modules are those modules that are connected to the different transfer modules of FIG. 2B, for example.

Once the proper modules have been connected to the cluster architecture in operation 504, the method moves to operation 506, where a recipe is defined for traversing a substrate for processing in each of the ambient processing stages. The recipe will depend on the desired outcome of the processing, but a unifying feature of the traversing of the substrate is that the ambient is specifically controlled in each one of the stages to ensure optimum processing of the layers, features, or processing. Next, the method moves to operation 508 where a substrate is provided for processing the identified layer or feature.

The substrate may be in the form of a semiconductor wafer, which may or may not have specific layers formed thereon or previously fabricated thereon. At this stage, the wafer that was provided in operation 508 is transitioned into a lab-ambient control transfer module 510. The lab-ambient controlled transfer module 510 may be optionally controlled so as to provide an inert environment. The inert environment is one which may, for example, provide a low oxygen or zero oxygen environment.

The reduced oxygen environment will also assist in not exposing a substrate or its surfaces to oxygen when processing in any one of the wet processing modules, that may be interconnected to the lab-ambient control transfer module. Therefore, as defined herein, "lab ambient" shall be construed to include both situations in which the ambient is controlled by defining a type of inert environment, where the environment can be pumped and then replenished with an inert gas. The pumping of the environment is done to remove oxygen or substantially remove all of the oxygen during the processing in the lab-ambient control transfer module or modules connected thereto.

The method now moves to operation 512, where wet processing in on or more of the modules connected to the lab-ambient controlled transfer module, is performed. Optionally, some process sequenced may not require a wet process prior to the vacuum process. The various wet processing operations, as defined above, may include proximity head meniscus processing, SRD processing, brush processing, and any other type of processing that can include the use of fluids (Newtonian fluids and non-Newtonian fluids).

Now, in operation 514, the process moves to a decision point where it is determined whether to process the substrate in a dry process or move to an inert ambient layer formation step. In this example, it is assumed that it is desired to moved to a plasma process, and a transition is allowed to occur to operation 516. In operation 516, transition may occur into a vacuum transfer module. The transitions between the wet processing into the vacuum transfer module is such that a dry wafer is transferred between the wet processing and into the vacuum transfer module.

In the transitions, the load locks and valves enable the wafer to move between the modules. In operation 518, a plasma processing operation may be performed in one or more of the modules connected to the vacuum transfer module. As mentioned above, different types of plasma operations may be performed, depending on the type of plasma systems and chambers that are connected to the transfer module. At this point, it is determined in operation 520 whether lab-ambient layer formation is desired or if the wafer should be moved back to a wet clean or a wet etch operation.

If wet clean or wet etch operations are desired, the method may move back to operation 510 where a transition through the transfer modules and into the lab-ambient control transfer module is performed. If it is desired to perform an inert ambient layer formation, the method will move to operation 522. In operation 522, a transition is caused to occur into the controlled ambient transfer module. In the controlled ambient transfer module, the substrate can be moved into one of the many types of inner ambient layer formation modules. The inert ambient layer formation modules are modules that are connected to the controlled ambient transfer module.

Examples of the controlled ambient layer formation modules may be plating modules that use electroless processes, or electroplating. In addition to electroplating, and electroless plating, the substrate may also be moved into a module that allows dry-in and dry-out processing of the substrate. Examples of dry-in and dry-out processing may include proximity head processing that applies a meniscus to the surface of the wafer. Accordingly, once the processing is performed in the inert ambient layer formation modules in operation 524, decision operations may be performed in step 526.

In step 526, it is determined whether additional transitions are required into the vacuum transfer module 516 or back into the lab-ambient controlled transfer module in 510. Once the number of transitions have occurred through the various transfer modules that are controlled for ambient properties, and the formation of the desired layers or coating of features, depending on the application, is concluded, the method may end. Of course, the ending of this method may only signify the beginning of a next process sequence of fabrication.

Although reference is made to fabricating specific layers, interfaces, or features in the method operations of process 500, it should be understood that the various layers, processes, and fabrication steps may be repeating many times in order to fabricate integrated circuit devices. The integrated circuit devices can then be packaged and placed into an electronic components, which may be used to process, store, transfer, display, or present data in electronics.

The control systems and electronics of that manage and interface with the cluster architectures modules, robots, and the like, may be controlled in an automated way using computer control. Thus, aspects of the invention may be practiced with other computer system configurations including handheld devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A cluster architecture for processing a substrate, comprising:
    (a) at a first location, a lab-ambient controlled transfer module for accepting substrates into and out of the cluster architecture,
        the lab-ambient controlled transfer module being coupled to one or more wet substrate processing modules, the lab-ambient controlled transfer module and the one or more wet substrate processing modules configured to manage a first ambient environment, and an interface between the lab-ambient controlled transfer module and one or more wet substrate processing module is defined, such that an end effector handles the substrate in a dry-in state into one of the wet substrate processing modules and a dry-out state out of one of the wet substrate processing modules, wherein at least one of the wet substrate processing modules is a proximity head system, the proximity head system produces a meniscus between a surface of the proximity head and a surface of the substrate, the substrate is configured to be held by a carrier in the proximity head system and the carrier is movable along a track of the proximity head system;

wherein the track of the proximity head system is parallel to a track of the end effector of the lab-ambient controlled transfer module;

(b) at a second location, a vacuum transfer module being directly coupled to a first load lock, with the lab-ambient controlled transfer module being directly coupled to the same first load lock, the first load lock configured for dry transfer;

the vacuum transfer module being coupled to one or more plasma processing modules, the vacuum transfer module and the one or more plasma processing modules configured to manage a second ambient environment; and (c) at a third location, a controlled ambient transfer module being directly coupled to a second load lock, with the vacuum transfer module being directly coupled to the same second load lock, the second load lock configured for dry transfer;

the controlled ambient transfer module being coupled to one or more ambient processing modules, the controlled ambient transfer module and the one or more ambient processing modules configured to manage a third ambient environment;

wherein the second location is between the first and third locations;

wherein the cluster architecture defines a controlled processing of the substrate in each of the first, second and third ambient environments and wherein the first, second and third environments are isolated from an uncontrolled clean room environment outside of the cluster architecture;

wherein the one or more ambient processing modules include a metallic plating system.

2. The cluster architecture as recited in claim 1, wherein the third ambient environment is an inert ambient that is substantially free of oxygen.

3. The cluster architecture as recited in claim 1, wherein the first ambient environment is an inert ambient that is substantially free of oxygen.

4. The cluster architecture as recited in claim 1, wherein the second ambient environment is capable of being set in vacuum.

5. The cluster architecture as recited in claim 1, wherein the metallic plating systems include electroplating and electroless plating systems.

6. The cluster architecture as recited in claim 1, wherein a non-Newtonian fluid is used in one of the wet substrate processing modules.

7. The cluster architecture as recited in claim 1, wherein a brush system is used in a wet substrate processing module.

8. The cluster architecture as recited in claim 1, wherein the lab-ambient controlled transfer module is defined by a stretch module having a track and an end effector for moving substrates into and out of the one or more wet substrate processing modules.

9. A cluster architecture for processing a substrate, comprising:

(a) at a first location, configured to receive substrates into and out of the cluster architecture, a lab-ambient controlled transfer module being coupled to one or more wet substrate processing modules, the lab-ambient controlled transfer module and the one or more wet substrate processing modules configured to manage a first ambient environment, wherein at least one of the wet substrate processing modules is a proximity head system, the proximity head system produces a meniscus between a surface of the proximity head and a surface of the substrate, the substrate is configured to be held by a carrier in the proximity head system and the carrier movable along a track of the proximity head system;

wherein the track of the proximity head system is parallel to a track of an end effector of the lab-ambient controlled transfer module;

(b) at a second location, a first load lock directly coupled to the lab-ambient controlled transfer module on a first side of the first load lock and directly coupled to a vacuum transfer module on a side opposite the first side of the first load lock, the first load lock configured for dry transfer, the vacuum transfer module coupled to one or more plasma processing modules, the vacuum transfer module and the one or more plasma processing modules configured to manage a second ambient environment; and (c) at a third location, a second load lock directly coupled to the vacuum transfer module on a first side of the second load lock and directly coupled to a controlled ambient transfer module on a side opposite the first side of the second load lock, the second load lock configured for dry transfer, the controlled ambient transfer module being coupled to one or more ambient processing modules, and wherein one or more of the ambient processing modules include a metallic plating system, the controlled ambient transfer module and the one or more ambient processing modules configured to manage a third ambient environment;

wherein the second location is between the first and third locations;

wherein the cluster architecture enables controlled processing of the substrate in either the first, second or third ambient environments, wherein the first, second and third ambient environments are isolated by slot valves and the load locks, the slot valves define isolation between the ambient environments when transitions of the substrate are provided through the load locks, where dry plasma processing and wet processing is enabled within the cluster architecture without exposure of the substrate to an oxygen environment that is outside of the cluster architecture.

10. A cluster architecture for processing a substrate, comprising:

a lab-ambient controlled transfer module configured to receive substrates into and out of the cluster architecture, the lab-ambient controlled transfer module being coupled to one or more wet substrate processing modules, the lab-ambient controlled transfer module and the one or more wet substrate processing modules configured to manage a first ambient environment, wherein at least one of the wet substrate processing modules is a proximity head system, the proximity head system produces a meniscus between a surface of the proximity head and a surface of the substrate, the substrate is configured to be held by a carrier in the proximity head system and the carrier movable along a track of the proximity head system;

an end effector in the lab-ambient controlled transfer module, the end effector movable along a linear track, the end effector moving wafers in and out of the one or more wet substrate processing modules in a dry state;

wherein the track of the proximity head system is parallel to the linear track of the end effector of the lab-ambient controlled transfer module;

a vacuum transfer module being directly coupled to a first load lock that directly couples to the lab-ambient controlled transfer module, the first load lock configured for dry transfer, the vacuum transfer module being coupled to one or more plasma processing modules, the vacuum transfer module and the one or more plasma processing modules configured to manage a second ambient environment, the end effector communicating dry substrates from the lab-ambient controlled module to the vacuum transfer module through the first load lock; and a controlled ambient transfer module being directly coupled to a second load lock that directly couples to the vacuum transfer module, the second load lock configured for dry transfer, the controlled ambient transfer module being coupled to one or more ambient processing modules, and wherein one or more of the ambient processing modules include a metallic plating system, the controlled ambient transfer module and the one or more ambient processing modules configured to manage a third ambient environment that is configurable as an inert ambient that is substantially free of oxygen;

wherein the vacuum transfer module is between the lab-ambient controlled transfer module and the controlled ambient transfer module;

wherein the cluster architecture enables controlled processing of the substrate in either the first, second or third ambient environments, and during operation, the first, second and third environments are configured to be isolated from an uncontrolled clean room environment outside of the cluster architecture.

11. The cluster architecture as recited in claim 10, wherein the first ambient environment is an inert ambient that is substantially free of oxygen.

12. The cluster architecture as recited in claim 10, wherein the metallic plating systems include electroplating and electroless plating systems.

13. The cluster architecture as recited in claim 10, further comprising, a computer for controlling movement of the substrate between the first, second and third ambient environments and into and out of processing modules connected to respective ones of the ambient environments.

* * * * *